United States Patent
Zhang et al.

(10) Patent No.: US 10,332,839 B2
(45) Date of Patent: Jun. 25, 2019

(54) INTERCONNECT STRUCTURE AND FABRICATING METHOD THEREOF

(71) Applicant: United Microelectronics Corp., Hsinchu (TW)

(72) Inventors: Keen Zhang, Singapore (SG); Ji Feng, Singapore (SG); De-Jin Kong, Singapore (SG); Yun-Fei Li, Singapore (SG); Guo-Hai Zhang, Singapore (SG); Ching-Hwa Tey, Singapore (SG); Jing Feng, Singapore (SG)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 15/400,600

(22) Filed: Jan. 6, 2017

(65) Prior Publication Data
US 2018/0197819 A1   Jul. 12, 2018

(51) Int. Cl.
*H01L 21/00* (2006.01)
*H01L 23/532* (2006.01)
*H01L 21/768* (2006.01)
*H01L 23/528* (2006.01)

(52) U.S. Cl.
CPC .. *H01L 23/53295* (2013.01); *H01L 21/76802* (2013.01); *H01L 21/76834* (2013.01); *H01L 21/76895* (2013.01); *H01L 23/5283* (2013.01); *H01L 23/53228* (2013.01)

(58) Field of Classification Search
None
See application file for complete search history.

(56) References Cited

U.S. PATENT DOCUMENTS

| | | | |
|---|---|---|---|
| 6,087,278 A | 7/2000 | Kim et al. | |
| 6,303,423 B1 * | 10/2001 | Lin | H01L 21/768 257/E21.004 |
| 8,629,559 B2 | 1/2014 | Lu et al. | |
| 8,741,732 B2 | 6/2014 | Wu et al. | |
| 2010/0038825 A1 * | 2/2010 | McDonald | B23K 26/006 264/400 |
| 2010/0078690 A1 * | 4/2010 | Sugiyama | H01L 21/02164 257/288 |
| 2012/0217641 A1 | 8/2012 | Chen et al. | |
| 2013/0247975 A1 * | 9/2013 | Do | H01L 31/02167 136/256 |
| 2014/0015086 A1 * | 1/2014 | Yu | H01L 27/14618 257/443 |
| 2015/0235955 A1 * | 8/2015 | Kudo | H01L 23/53238 257/751 |
| 2016/0225616 A1 * | 8/2016 | Li | H01L 21/0217 |
| 2017/0098606 A1 * | 4/2017 | Lu | H01L 21/0273 |

* cited by examiner

*Primary Examiner* — Reema Patel
(74) *Attorney, Agent, or Firm* — J.C. Patents

(57) ABSTRACT

An interconnect structure including a substrate, at least one ultra-thick metal (UTM) layer, a first dielectric layer and at least one pad metal layer is provided. The at least one UTM layer is disposed on the substrate. The first dielectric layer is disposed on the at least one UTM layer and exposes the at least one UTM layer. A stress of the first dielectric layer is −150 Mpa to −500 Mpa. The at least one pad metal layer is disposed on the first dielectric layer and electrically connected to the at least one UTM layer exposed by the first dielectric layer.

18 Claims, 2 Drawing Sheets

INTERCONNECT STRUCTURE AND FABRICATING METHOD THEREOF

BACKGROUND OF THE INVENTION

Field of the Invention

The invention relates to a conductive structure and a fabricating method thereof; and more particularly relates to an interconnect structure and a fabricating method thereof.

Description of Related Art

An ultra-thick metal (UTM) technology is applied in integrated circuits to reduce the resistance. However, due to the high tensile stress of the UTM layer, the crack is easily happened in the passivation layer covering the UTM layer. The crack may also propagate from the passivation layer to the underlying dielectric layers. Therefore, the yield and the reliability of the UTM product is reduced.

SUMMARY OF THE INVENTION

The invention provides an interconnect structure and a fabricating method thereof, which can prevent the problem of film cracking.

The invention provides an interconnect structure, which includes a substrate, at least one ultra-thick metal (UTM) layer, a first dielectric layer and at least one pad metal layer. The at least one UTM layer is disposed on the substrate. The first dielectric layer is disposed on the at least one UTM layer and exposes the at least one UTM layer. A stress of the first dielectric layer is −150 Mpa to −500 Mpa. The at least one pad metal layer is disposed on the first dielectric layer and electrically connected to the at least one UTM layer exposed by the first dielectric layer.

According to an embodiment of the invention, in the interconnect structure, a material of the first dielectric layer is silicon oxide, for example.

According to an embodiment of the invention, the interconnect structure further includes a blocking layer. The blocking layer is disposed between the first dielectric layer and the at least one UTM layer.

According to an embodiment of the invention, in the interconnect structure, a material of the blocking layer is silicon nitride, for example.

According to an embodiment of the invention, in the interconnect structure, the number of the at least one UTM layer is plural, and the number of the at least one pad metal layer is plural, for example.

According to an embodiment of the invention, the interconnect structure further includes a second dielectric layer. The second dielectric layer is disposed between the UTM layers.

According to an embodiment of the invention, the interconnect structure further includes a passivation layer structure. The passivation layer structure is disposed on a surface of an opening between the pad metal layers. The passivation layer structure may include a first passivation layer and a second passivation layer. The first passivation layer is disposed on the surface of the opening between the pad metal layers. The second passivation layer is disposed on the first passivation layer.

According to an embodiment of the invention, in the interconnect structure, the passivation layer structure can further extend on a portion of the pad metal layers.

According to an embodiment of the invention, in the interconnect structure, a stress of the first passivation layer is −50 Mpa to −200 Mpa, for example.

According to an embodiment of the invention, in the interconnect structure, a material of the first passivation layer is high density plasma-chemical vapor deposition (HDP-CVD) oxide, for example.

According to an embodiment of the invention, in the interconnect structure, a material of the second passivation layer is silicon nitride, for example.

The invention provides a method of fabricating an interconnect structure, which includes the following steps. At least one UTM layer is formed on a substrate. A first dielectric layer is formed on the at least one UTM layer. The first dielectric layer exposes the at least one UTM layer. A stress of the first dielectric layer is −150 Mpa to −500 Mpa. At least one pad metal layer is formed on the first dielectric layer. The at least one pad metal layer is electrically connected to the at least one UTM layer exposed by the first dielectric layer.

According to an embodiment of the invention, in the method of fabricating the interconnect structure, a method of forming the at least one UTM layer is a damascene method, for example.

According to an embodiment of the invention, in the method of fabricating the interconnect structure, a method of forming the first dielectric layer is a plasma-enhanced chemical vapor deposition (PECVD) method, for example.

According to an embodiment of the invention, in the method of fabricating the interconnect structure, a method of forming the at least one pad metal layer is a combination of a deposition process, a lithography process, and an etching process, for example.

According to an embodiment of the invention, in the method of fabricating the interconnect structure, the number of the at least one UTM layer is plural, and the number of the at least one pad metal layer is plural, for example.

According to an embodiment of the invention, the method of fabricating the interconnect structure further includes forming a second dielectric layer between the UTM layers.

According to an embodiment of the invention, the method of fabricating the interconnect structure further includes forming a passivation layer structure on a surface of an opening between the pad metal layers. The passivation layer structure may include a first passivation layer and a second passivation layer. The first passivation layer is disposed on the surface of the opening between the pad metal layers. The second passivation layer is disposed on the first passivation layer.

According to an embodiment of the invention, in the method of fabricating the interconnect structure, a method of forming the first passivation layer is a HDP-CVD method, for example.

Based on the above description, in the interconnect structure and the fabricating method according to the invention, since the first dielectric layer is disposed on the UTM layer and has a stress of −150 Mpa to −500 Mpa, the compressive stress of the first dielectric layer can be used to offset the tensile stress of the UTM layer, and the problem of film cracking can be prevented. Therefore, the yield and the reliability of the UTM product can be increased.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
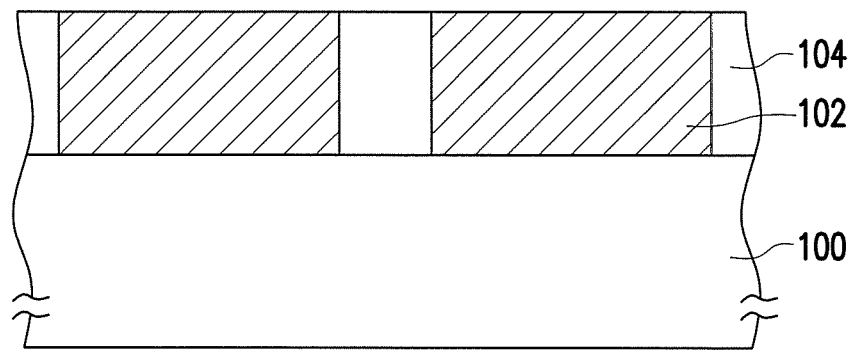
FIG. 1A to FIG. 1C are cross-sectional views illustrating an interconnect structure according to an embodiment of the invention.
Figure 1B:
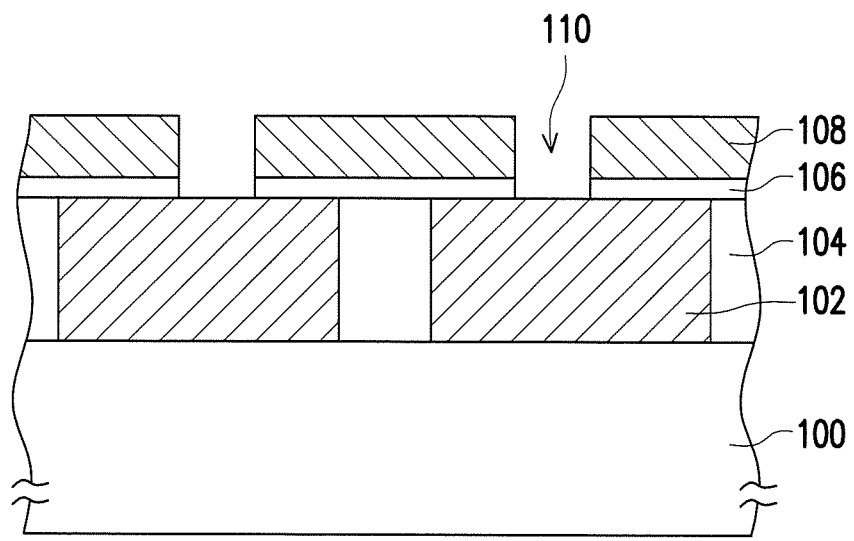
Figure 1C:
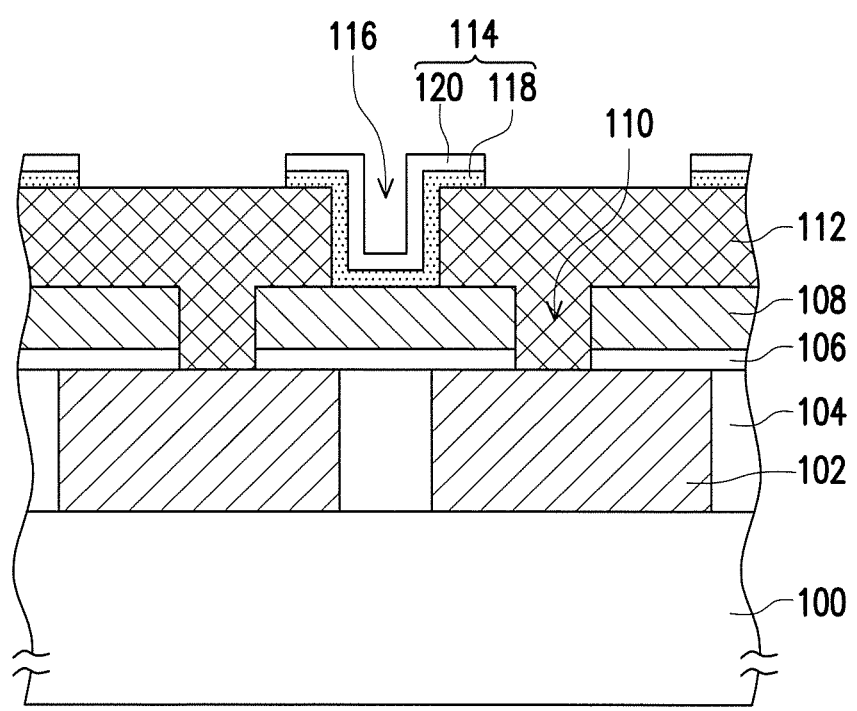

FIG. 1A to FIG. 1C are cross-sectional views illustrating an interconnect structure according to an embodiment of the invention.

Referring to FIG. 1A, at least one UTM layer 102 is formed on a substrate 100. The substrate 100 may be a single-layer substrate or a multi-layer substrate that may have other layers (not shown), conductive devices (not shown), or semiconductor devices (not shown) formed thereon. In this embodiment, the number of the at least one UTM layer 102 is plural, for example, but the invention is not limited thereto. A material of the UTM layer 102 is copper (Cu), for example. A method of forming the UTM layer 102 is a damascene method, for example.

A dielectric layer 104 may be selectively formed between the UTM layers 102. The dielectric layer 104 may be a single-layer structure or a multi-layer structure. A material of the dielectric layer 104 is silicon oxide, silicon nitride or a combination thereof, for example. A method of forming the dielectric layer 104 is a combination of a deposition process, a lithography process, and an etching process, for example. When the UTM layer 102 is formed by performing a damascene process, in the damascene process of forming the UTM layer 102, the dielectric layer 104 may be formed before forming the UTM layer 102.

Referring to FIG. 1B, a blocking layer 106 may be selectively formed on the UTM layer 102. A material of the blocking layer 106 is silicon nitride, for example.

A dielectric layer 108 is formed on the blocking layer 106. The dielectric layer 108 exposes the at least one UTM layer 102. For example, the dielectric layer 108 may expose the at least one UTM layer 102 through an opening 110. A stress of the dielectric layer 108 is −150 Mpa to −500 Mpa. Therefore, the dielectric layer 108 can have the compressive stress to offset the tensile stress of the UTM layer 102, and the problem of film cracking can be prevented. A material of the dielectric layer 108 is silicon oxide, for example.

In this embodiment, a method of forming the blocking layer 106 and the dielectric layer 108 may include the following steps. A blocking material layer (not shown) and a dielectric material layer (not shown) are formed on the UTM layer 102 in order. A method of forming the blocking material layer is a chemical vapor deposition (CVD) method, for example. A method of forming the dielectric material layer is plasma-enhanced chemical vapor deposition (PECVD) method, for example. A patterning process is performed on the dielectric material layer and the blocking material layer to form the dielectric layer 108 and the blocking layer 106, wherein the opening 110 is formed in the dielectric layer 108 and the blocking layer 106 to expose the UTM layer 102.

Referring to FIG. 1C, at least one pad metal layer 112 is formed on the dielectric layer 108. In this embodiment, the number of the at least one pad metal layer 112 is plural, for example, but the invention is not limited thereto. The pad metal layer 112 is electrically connected to the UTM layer 102 exposed by the dielectric layer 108. For example, the pad metal layer 112 is filled in the opening 110 to be electrically connected to the UTM layer 102. A material of the pad metal layer 112 is aluminum (Al), for example. A method of forming the pad metal layer 112 is a combination of a deposition process, a lithography process, and an etching process, for example.

A passivation layer structure 114 may be selectively formed on a surface of an opening 116 between the pad metal layers 112. The passivation layer structure 114 can further extend on a portion of the pad metal layers 112.

The passivation layer structure 114 may be a single-layer structure or a multi-layer structure. In this embodiment, the passivation layer structure 114 is exemplified by a multi-layer structure, but the invention is not limited thereto. For example, the passivation layer structure 114 can include a passivation layer 118 and a passivation layer 120. The passivation layer 118 is disposed on the surface of the opening 116 between the pad metal layers 112. A stress of the passivation layer 118 is −50 Mpa to −200 Mpa, for example. A material of the passivation layer 118 is high density plasma-chemical vapor deposition (HDP-CVD) oxide, for example. The passivation layer 120 is disposed on the passivation layer 118. A material of the passivation layer 120 is silicon nitride, for example.

In this embodiment, a method of forming the passivation layer 118 and the passivation layer 120 may include the following steps. A first passivation material layer (for forming the passivation layer 118, not shown) and a second passivation material layer (for foil ling the passivation layer 120, not shown) are conformally formed on the pad metal layer 112 in order. A method of forming the first passivation material layer is a HDP-CVD method, for example. A method of forming the second passivation material layer is the CVD method, for example. A patterning process is performed on the second passivation material layer and the first passivation material layer to form the passivation layer 120 and the passivation layer 118.

When the passivation layer 118 is formed by the HDP-CVD method, the passivation layer 118 is hard and compact, so that the passivation layer 118 can further prevent film cracking.

Based on the above, it is known that in the fabricating method of the interconnect structure of the above embodiment, since the dielectric layer 108 is disposed on the UTM layer 102 and has a stress of −150 Mpa to −500 Mpa, the compressive stress of the dielectric layer 108 can be used to offset the tensile stress of the UTM layer 102, and the problem of film cracking can be prevented. Therefore, the yield and the reliability of the UTM product can be increased.

The interconnect structure of this embodiment is described hereinafter with reference to FIG. 1C. Although the interconnect structure is fabricated by the aforementioned fabricating method in this embodiment, it is merely an example and the fabricating method of the interconnect structure of the invention is not limited thereto.

Referring to FIG. 1C, the interconnect structure includes a substrate 100, at least one UTM layer 102, a dielectric layer 108 and at least one pad metal layer 112. The UTM layer 102 is disposed on the substrate 100. The dielectric layer 108 is disposed on the UTM layer 102 and exposes the UTM layer 102. A stress of the dielectric layer 108 is −150 Mpa to −500 Mpa. The pad metal layer 112 is disposed on the dielectric layer 108 and electrically connected to the UTM layer 102 exposed by the dielectric layer 108.

Furthermore, the interconnect structure can selectively include at least one of a dielectric layer 104, a blocking layer 106 and a passivation layer structure 114. The dielectric layer 104 is disposed between the UTM layers 102. The blocking layer 106 is disposed between the dielectric layer 108 and the UTM layer 102. The passivation layer structure 114 is disposed on a surface of an opening 116 between the pad metal layers 112. The passivation layer structure 114 may include a passivation layer 118 and a passivation layer 120. The passivation layer 118 is disposed on the surface of the opening 116 between the pad metal layers 112. The passivation layer 120 is disposed on the passivation layer 118.

Moreover, the material, arrangement, forming method, and efficiency of each component in the interconnect structure have been specified in the above embodiment of the fabricating method of FIG. 1A to FIG. 1C, and thus are not repeated hereinafter.

In summary, according to the interconnect structure and the fabricating method of the above embodiment, the dielectric layer disposed on the UTM layer has a stress of −150 Mpa to −500 Mpa, so that the compressive stress of the dielectric layer can be used to offset the tensile stress of the UTM layer, and the problem of film cracking can be prevented. Therefore, the yield and the reliability of the UTM product can be increased.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. An interconnect structure, comprising:
   a substrate;
   at least one ultra-thick metal (UTM) layer disposed on the substrate;
   a first dielectric layer disposed on the at least one UTM layer and exposing the at least one UTM layer, wherein the first dielectric layer is a plasma-enhanced chemical vapor deposition (PECVD) dielectric layer, and a stress of the PECVD dielectric layer is larger than or equal to −500 Mpa, and less than or equal to −420 Mpa; and
   at least one pad metal layer disposed on the first dielectric layer and electrically connected to the at least one UTM layer exposed by the first dielectric layer.

2. The interconnect structure of claim 1, wherein a material of the first dielectric layer comprises silicon oxide.

3. The interconnect structure of claim 1, further comprising a blocking layer disposed between the first dielectric layer and the at least one UTM layer.

4. The interconnect structure of claim 3, wherein a material of the blocking layer comprises silicon nitride.

5. The interconnect structure of claim 1, wherein the number of the at least one UTM layer is plural, and the number of the at least one pad metal layer is plural.

6. The interconnect structure of claim 5, further comprising a second dielectric layer disposed between the UTM layers.

7. The interconnect structure of claim 5, further comprising a passivation layer structure disposed on a surface of an opening between the pad metal layers, wherein the passivation layer structure comprises:
   a first passivation layer disposed on the surface of the opening between the pad metal layers; and
   a second passivation layer disposed on the first passivation layer.

8. The interconnect structure of claim 7, wherein the passivation layer structure further extends on a portion of the pad metal layers.

9. The interconnect structure of claim 7, wherein a stress of the first passivation layer is −50 Mpa to −200 Mpa.

10. The interconnect structure of claim 7, wherein a material of the first passivation layer comprises high density plasma-chemical vapor deposition (HDP-CVD) oxide.

11. The interconnect structure of claim 7, wherein a material of the second passivation layer comprises silicon nitride.

12. A method of fabricating an interconnect structure, comprising:
    forming at least one UTM layer on a substrate;
    forming a first dielectric layer on the at least one UTM layer, wherein the first dielectric layer exposes the at least one UTM layer, the first dielectric layer is a plasma-enhanced chemical vapor deposition (PECVD) dielectric layer, and a stress of the PECVD dielectric layer is larger than or equal to −500 Mpa, and less than or equal to −420 Mpa; and
    forming at least one pad metal layer on the first dielectric layer, wherein the at least one pad metal layer is electrically connected to the at least one UTM layer exposed by the first dielectric layer.

13. The method of fabricating the interconnect structure of claim 12, wherein a method of forming the at least one UTM layer comprises a damascene method.

14. The method of fabricating the interconnect structure of claim 12, wherein a method of forming the at least one pad metal layer comprises a combination of a deposition process, a lithography process, and an etching process.

15. The method of fabricating the interconnect structure of claim 12, wherein the number of the at least one UTM layer is plural, and the number of the at least one pad metal layer is plural.

16. The method of fabricating the interconnect structure of claim 15, further comprising forming a second dielectric layer between the UTM layers.

17. The method of fabricating the interconnect structure of claim 15, further comprising forming a passivation layer structure on a surface of an opening between the pad metal layers, wherein the passivation layer structure comprises:
    a first passivation layer disposed on the surface of the opening between the pad metal layers; and
    a second passivation layer disposed on the first passivation layer.

18. The method of fabricating the interconnect structure of claim 17, wherein a method of forming the first passivation layer comprises a HDP-CVD method.

* * * * *